(12) United States Patent
Keil

(10) Patent No.: US 9,843,395 B2
(45) Date of Patent: Dec. 12, 2017

(54) ON BOARD TRANSCEIVER

(71) Applicant: FCI Asia Pte. Ltd., Singapore (SG)

(72) Inventor: Ulrich Keil, Besancon (FR)

(73) Assignee: FCI Asia Pte. Ltd., KA Place (SG)

( * ) Notice: Subject to any disclaimer, the term of this patent is extended or adjusted under 35 U.S.C. 154(b) by 68 days.

(21) Appl. No.: 14/893,965

(22) PCT Filed: May 29, 2013

(86) PCT No.: PCT/IB2013/001329
§ 371 (c)(1),
(2) Date: Nov. 25, 2015

(87) PCT Pub. No.: WO2014/191786
PCT Pub. Date: Dec. 4, 2014

(65) Prior Publication Data
US 2016/0105241 A1 Apr. 14, 2016

(51) Int. Cl.
*H04B 10/40* (2013.01)
*H01S 5/183* (2006.01)
(Continued)

(52) U.S. Cl.
CPC .......... *H04B 10/40* (2013.01); *G02B 6/4272* (2013.01); *G02B 6/4273* (2013.01); *H01L 31/16* (2013.01);
(Continued)

(58) Field of Classification Search
CPC ..... H04B 10/40; H01S 5/02469; H01S 5/183; H05K 1/0204; H05K 1/181; H01L 31/16
(Continued)

(56) References Cited

U.S. PATENT DOCUMENTS 7,073,960 B2 * 7/2006 Anderl ................ H04B 10/806
361/688
7,339,963 B2 * 3/2008 Bozso ................. H01S 5/0428
372/38.02

(Continued)

FOREIGN PATENT DOCUMENTS

CN 1704783 A 12/2005
EP 1 602 955 A2 12/2005
(Continued)

OTHER PUBLICATIONS

Chinese Office Action for Chinese Application No. 201380077056.0 dated Aug. 26, 2016 and English Translation herewith.
(Continued)

*Primary Examiner* — Seung C Sohn
(74) *Attorney, Agent, or Firm* — Wolf, Greenfield & Sacks, P.C.

(57) ABSTRACT

An electrical component assembly includes a substrate and first and second electrical components attached to the substrate and operably connected with each other via the substrate. In use the first electrical component generates a first amount of heat and the second component generates a second amount of heat. The first component is thermally connected with a heat sink along a first heat path and the second component is connected with the heat sink along a second, different, heat path, such that the thermal conductivity between the first and second components is lower than the thermal conductivity of the first heat path and of the second heat path.

20 Claims, 4 Drawing Sheets

(51) Int. Cl.
*G02B 6/42* (2006.01)
*H01L 31/16* (2006.01)
*H01S 5/024* (2006.01)
*H05K 1/02* (2006.01)
*H05K 1/11* (2006.01)
*H05K 1/18* (2006.01)

(52) U.S. Cl.
CPC .......... *H01S 5/02469* (2013.01); *H01S 5/183* (2013.01); *H05K 1/0204* (2013.01); *H05K 1/115* (2013.01); *H05K 1/181* (2013.01)

(58) Field of Classification Search
USPC ........................................................ 250/553
See application file for complete search history.

(56) References Cited

U.S. PATENT DOCUMENTS

| | | | |
|---|---|---|---|
| 7,832,944 B2 | 11/2010 | Hosking et al. | |
| 7,898,808 B2 * | 3/2011 | Joiner ................ | H05K 7/20418 361/704 |
| 2002/0122636 A1 * | 9/2002 | Anderson ............ | G02B 6/4281 385/89 |
| 2002/0122637 A1 * | 9/2002 | Anderson ............. | G02B 6/421 385/89 |
| 2003/0174454 A1 | 9/2003 | Fu et al. ........................ | 361/103 |
| 2003/0201462 A1 * | 10/2003 | Pommer .............. | G02B 6/4201 257/200 |
| 2008/0124025 A1 * | 5/2008 | Bozso ................ | G02B 6/12004 385/31 |
| 2009/0122493 A1 | 5/2009 | Hosking et al. .............. | 361/719 |

FOREIGN PATENT DOCUMENTS

JP 2003-163408 6/2003
JP 4345138 B2 10/2009

OTHER PUBLICATIONS

International Search Report and Written Opinion for International Application No. PCT/IB2013/001329 dated Apr. 1, 2014.
International Preliminary Report on Patentability for International Application No. PCT/IB2013/001329 dated Dec. 10, 2015.

* cited by examiner

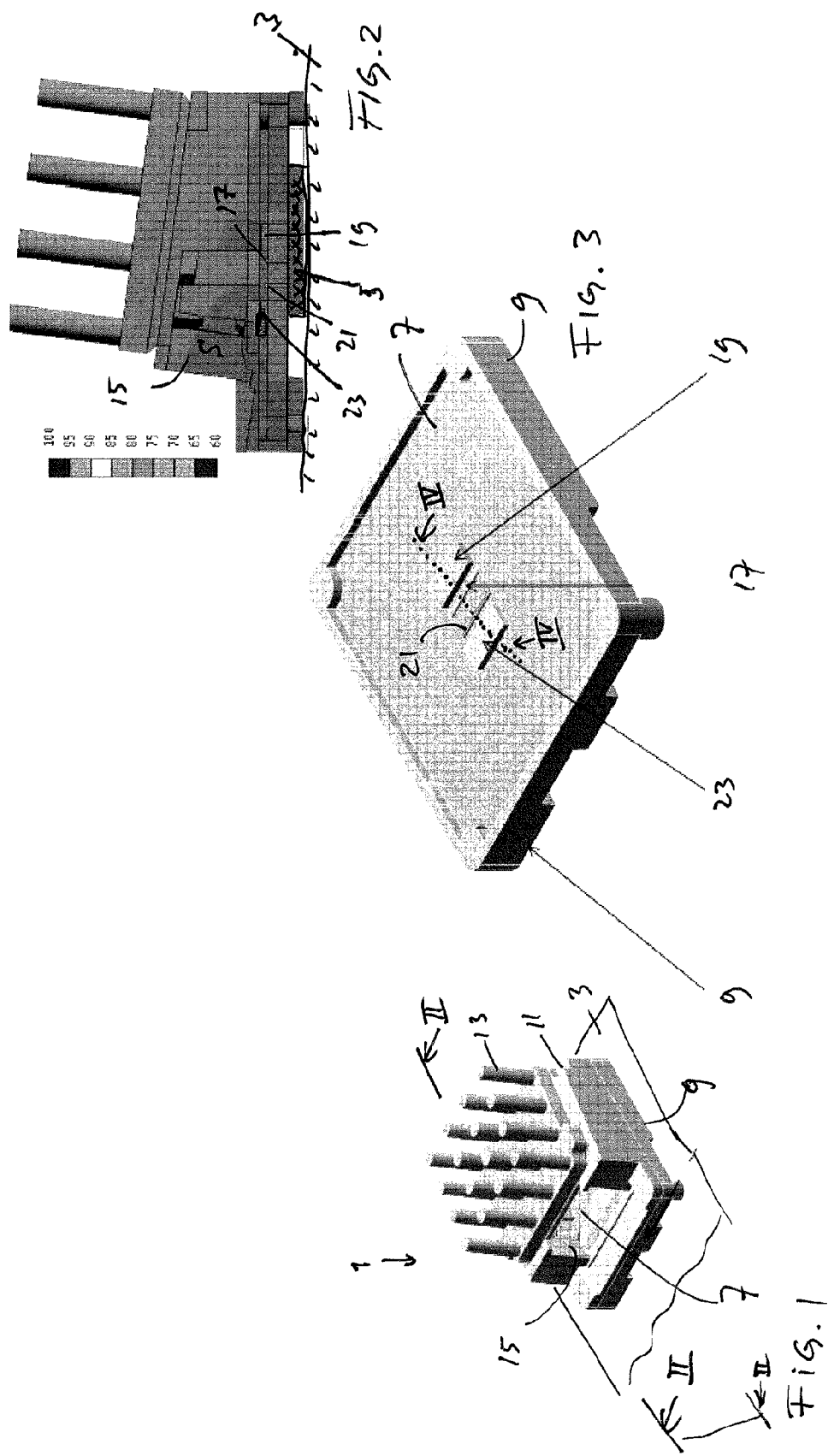

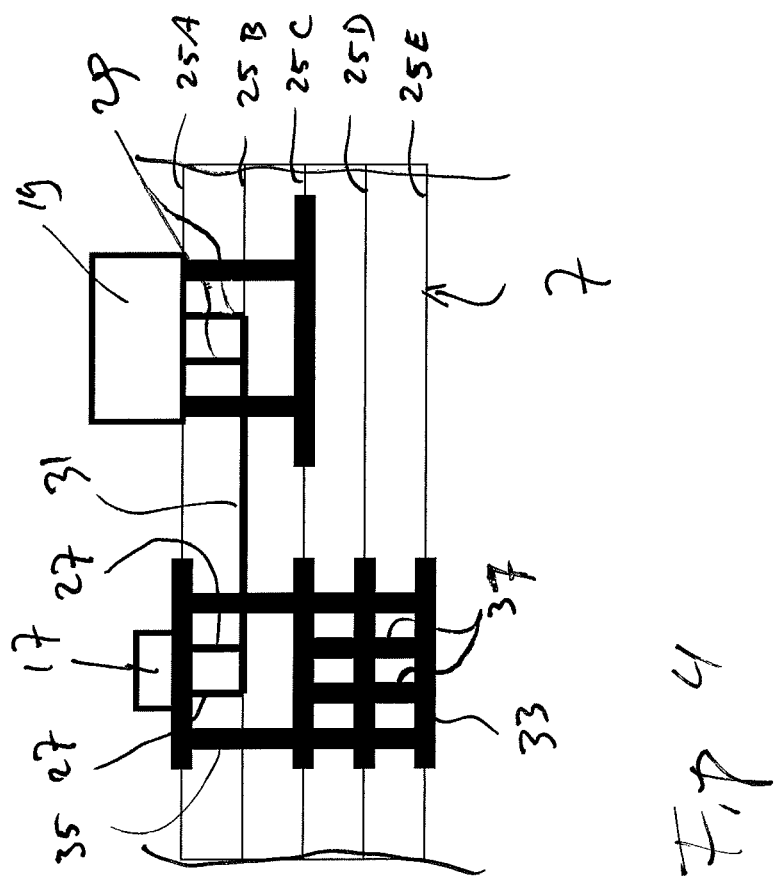

Fig. 7: Table 1

|  | no CDR | 1x CDR | 2x CDR |
|---|---|---|---|
| $P_{TIA}$ | 1.62 | 2.58 | 2.58 |
| $P_{VD}$ | 1 | 1 | 1.96 |
| $P_{VCSEL}$ | 0.2 | 0.2 | 0.2 |
| $P_{TOT}$ | 2.82 | 3.78 | 4.74 |

US 9,843,395 B2

ON BOARD TRANSCEIVER

RELATED APPLICATIONS

This application is the U.S. National Stage of and claims priority to and the benefit of International Patent Application Number PCT/IB2013/001329, entitled "ON BOARD TRANSCEIVER" filed on May 29, 2013, which is herein incorporated by reference in its entirety.

TECHNICAL FIELD

The present disclosure relates to heat dissipation in electronic circuits, in particular to arrangements of optical transmitters and more in particular on board transceivers, e.g. for optical communication such as with electrical to optical conversion elements.

BACKGROUND

There is an ongoing demand for faster communication, lower power consumption and reduced device sizes in electronics. This leads to conflicting demands with respect to robustness and costs.

Electrical components may dissipate significant amounts of energy which should be removed. Appropriate heat management with electronic or opto-electronic components has a direct effect to their reliability and performance. Electronic and opto-electronic components typically have strict temperature requirements for optimal operation. Overheating of an electronic or opto-electronic component within an (opto) electronic system may affect the entire system.

Also optical transceivers need to be cooled to improve their performance. An optical transceiver is typically configured to transmit and receive optical signals to and from a complementary optical connector via optically active devices, such as a light-emitting device and a light-receiving device.

An effective and trusted solution is use of thermal conductive substrates that enable efficient distribution of heat and transport of generated heat to a housing. However, in particular in the case of densely packed components and components that generate different amounts of heat, such solution still poses problems.

Improvements are therefore desired.

SUMMARY

Herewith, an assembly according to the appended claims is provided.

Accordingly, an electrical component assembly may comprise a substrate and first and second electrical components attached to the substrate and operably connected with each other via the substrate,
wherein in use the first electrical component generates a first amount of heat and the second component generates a second amount of heat,
wherein the first component is thermally connected with a heat sink along a first heat path and the second component is connected with a heat sink along a second, different, heat path,
such that the thermal conductivity between the first and second components is lower than the thermal conductivity of the first heat path and of the second heat path.
Thus, the temperatures of the first and second components are decoupled and a high temperature of the first component need not affect the second component and the other way around. It is preferred that the substrate has a low thermal conductivity to clearly separate the first and second components.

An opto-electrical component assembly may comprise a substrate, a light source and a light source driver attached to the substrate, and a heat sink. The light source is operably connected to the light source driver. The light source driver is thermally connected to a first heat sink providing a first heat path. The light source is thermally connected to a second heat sink, possibly the same as the first heat sink, along a second, different, heat path. Thus, the light source and the light source driver may independently lose heat and thermal coupling between the light source and the light source driver is reduced. As a result, the light source and the driver may be held at different operating temperatures.

The electrical component assembly may comprise or be a transceiver.

Such transceivers can be coupled to a substrate by means of a socket holding the transceiver. In some cases the socket may comprise an interposer, which is a board with a lower side presenting an array of contacts, typically a pin grid array (PGA) or ball grid array (BGA), to be connected to contacts on the substrate, and a top side similarly provided with an array of contacts, generally of a different type, to be connected to contacts at the lower side of the transceiver. To obtain high quality signal transfer, the contacts should be clean and the pressure on the contacts by the transceiver should be substantially equal for all contacts.

BRIEF DESCRIPTION OF THE DRAWINGS

The above-described aspects will hereafter be more explained with further details and benefits with reference to the drawings showing an embodiment of the invention by way of example.

In the drawings:

FIG. 1 is a perspective view of a transceiver;

FIG. 2 is a cross section view of the transceiver of FIG. 1 as indicated with line II-II;

FIG. 3 is a partial view of the transceiver of FIG. 1;

FIG. 4 is a partial cross section view of FIG. 3 as indicated with line IV-IV;

FIG. 7 is a table with simulation values for use with the scheme of FIG. 6;

DETAILED DESCRIPTION OF EMBODIMENTS

Figure 5:
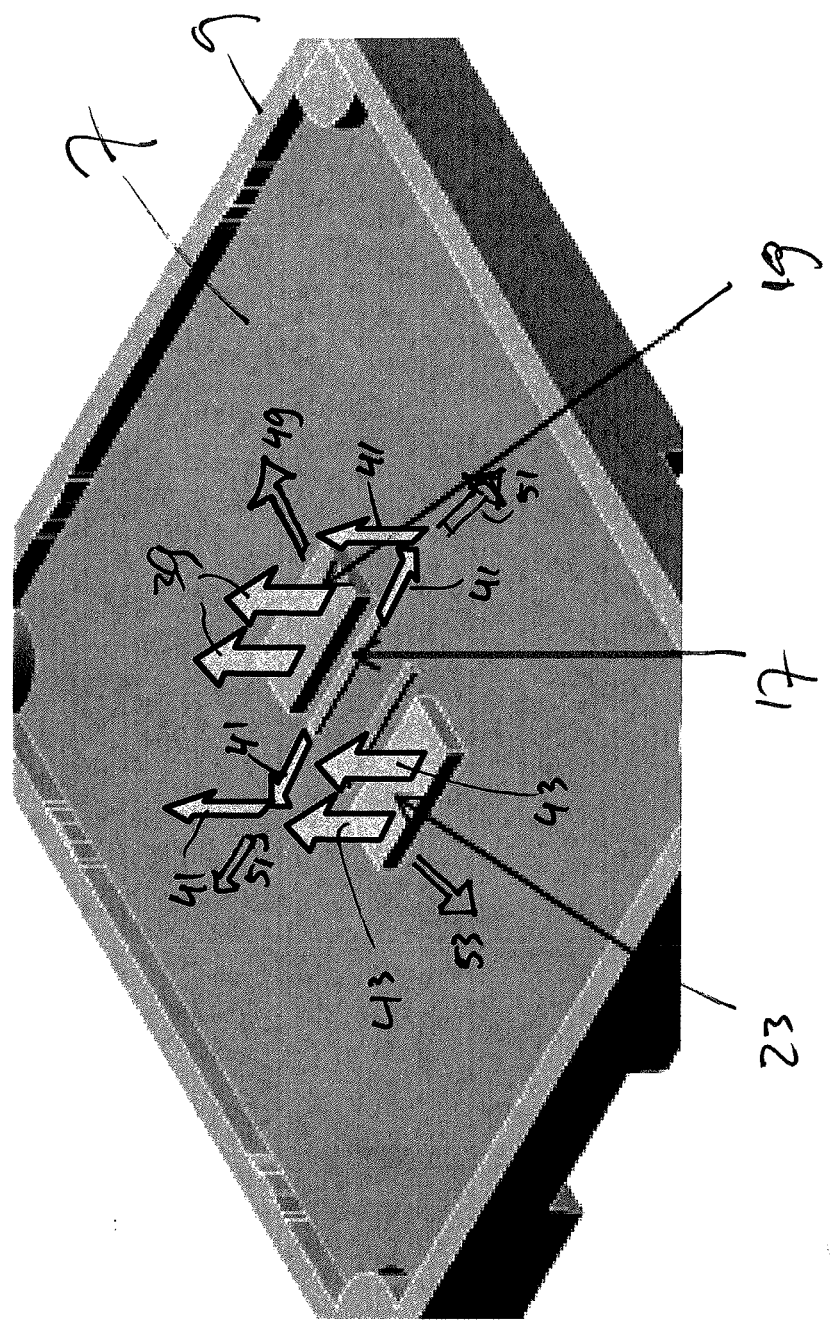
FIG. 5 is a close-up view with thermal flow patterns of the transceiver as in FIG. 3.

It is noted that the drawings are schematic, not necessarily to scale and that details that are not required for understanding the present invention may have been omitted. The terms "upward", "downward", "below", "above", and the like relate to the embodiments as oriented in the drawings, unless otherwise specified. Further, elements that are at least substantially identical or that perform an at least substantially identical function are denoted by the same numeral.

FIG. 1 shows a opto-electrical component assembly 1 in the form of a transceiver. FIG. 2 is a cross section of the transceiver 1. The transceiver 1 is configured for connection with a circuit board 3, via a connector or connector assembly, e.g. a pin grid array connector assembly or a ball grid array connector 5. In the shown embodiment, the transceiver 1 comprises a substrate 7, received in a socket 9, the substrate 7 being connected with the circuit board 3.

A housing part 11 is attached to the socket 9 and at least partly covers the substrate 7. A heat sink 13 is attached to the housing part 11 and via that to the socket 9.

The socket 9 and housing part 11 provide an entrance 15 to an interior space S of the transceiver accommodating the substrate 7 and allowing access for a connector, not shown, to components within the space S and/or on the substrate 7.

FIG. 3 shows the transceiver 1 without the heat sink 13 and the housing part 11, showing the socket 9 and the substrate 7 with relevant components. The transceiver 1 comprises a optical signal transmitters in the form of an array of VCSELs 17, operably connected with a VCSEL driver 19, optical signal receivers in the form of an array of photodiodes 21 operably connected with an amplifier 23, all attached to the substrate 7. It is noted that different and/or differently arranged optical signal transmitters may be employed. The same applies for the signal receivers.

The VCSEL driver 19 and the amplifier 23 dissipate significant amounts of energy in operation and thus generate significant amounts of heat.

Traditionally it is held that such heat should be distributed and diverted to the socket and/or transceiver housing and significant efforts have been spent in increasing thermal conductivity of transceiver substrates, while keeping the substrate material be electrically insulating. Consequently, transceiver substrates are commonly made of ceramic materials. These are relatively delicate, hard to process and expensive.

It is presently found that, in fact, such traditional solutions are counterproductive, as the high thermal conductivity leads to elevated temperatures of all components close to the heat sources. This includes the light sources.

In optical modules base on solid-state light sources, such as Light Emitting Diodes (LEDs), and more in particular such as Vertical Cavity Surface Emitting Laser (VCSEL)-based optical modules, the light source is typically the most temperature sensitive component. The maximum operating temperature for VCSELs may be limited to about 85 degrees Celsius, but moderate operating temperatures, e.g. about 65 degrees Celsius or below benefit lifetime and reliability significantly. Other components in an optical module like driver integrated circuits (ICs), microcontrollers, capacitors etc. can typically be operated up to about 120 degrees Celsius.

In typical devices about 10% or less of the power is dissipated in the light source (LED, VCSEL) itself. This means that a separate heat path, even with high thermal resistance for the light source results in significantly lower temperature of the light source than a common heat path with low thermal resistance.

The separation of heat paths as presented here results in a broader temperature application of the module.

FIG. 4 shows a cross section view of the substrate 7 including VCSELs 17 and VCSEL driver 19, as indicated with line IV in FIG. 3. The substrate 7 is a common multi-layer printed circuit board (PCB) substrate of organic insulating material with plural layers 25A-25E with conductive material, e.g. a fiber-reinforced polymeric substrate with patterned copper layers. The VCSELs 17 and VCSEL driver 19 are electrically connected with one or more conductive layers (here only 25B) with conductive vias 27, 29. The VCSELs 17 and VCSEL driver 19 are operably connected for driving the VCSELs 17 by the VCSEL driver 19 via traces 31 that extend on one or more of the conductive layers (here only 25B). The VCSELs 17 are further connected with vias 35 to lanes 33 on other conductive layers 25C-25E to different parts of the circuit board 7, these latter lanes 33 being also interconnected with optional further conductive vias 37 so as to reduce electrical and thermal resistivity in those portions.

The traces 31 are common conductive connections having relatively little width (e.g. tenths of a millimeter) and a relatively high electrical and thermal resistance with respect to the lanes 33 having relatively large width and a relatively low electrical and thermal resistance, e.g. being conductive paths of several times larger width and/or thickness compared with traces, e.g. several millimeters wide.

Since electrically conductive material tends to have significantly higher thermal conductivity than electrically insulating material, separating electrically conductive connections between electrical components down to the very minimum to ensure operational connections also decreases thermal conductivity. In particular, instead of sharing common ground planes in a circuit board and reducing electrical resistance to a minimum, it is herewith provided that electrical connections between closely arranged, e.g. adjacent, components are reduced to a minimum of traces and conductive material.

Best visible in FIG. 5, the thermal paths from different components 17, 19, 23 are different; the VCSEL driver 19 and amplifier 23, having relatively surface areas, emit heat by radiation and convection to air within the space S and/or conduct heat to a connector (not shown) abutting the VCSEL driver 19 and amplifier 23 when connected to the transceiver 1 (see arrows 39, 43 and/or conduct heat through optional thermal conductive elements extending from the heat sink 13 (not shown). Another route for thermal loss is through the substrate 7 to the socket 9 and housing 11 (arrows 49 and 53, respectively), and via these to the heat sink 13, which may be in a forced air flow from a ventilator and/or be arranged as another type of heat exchanger. Note that the heat sink 13 is arranged on an opposite side of the VCSEL driver 19 and amplifier 23 with respect to the substrate 7.

The VCSEL array 17 however, conducts heat by the vias 35, 37 and the lanes 33 away from the VCSEL driver to radiate away heat from the substrate 7 at different portions (arrows 41). Such portions may comprise a separate heat exchanger. Also, a heat path may be provided to the socket 9, housing 11 and heat sink 13 (arrows 51), however electrically and thermally substantially separated and insulated from the heat paths of the driver 19 and amplifier 23.

Figure 6:
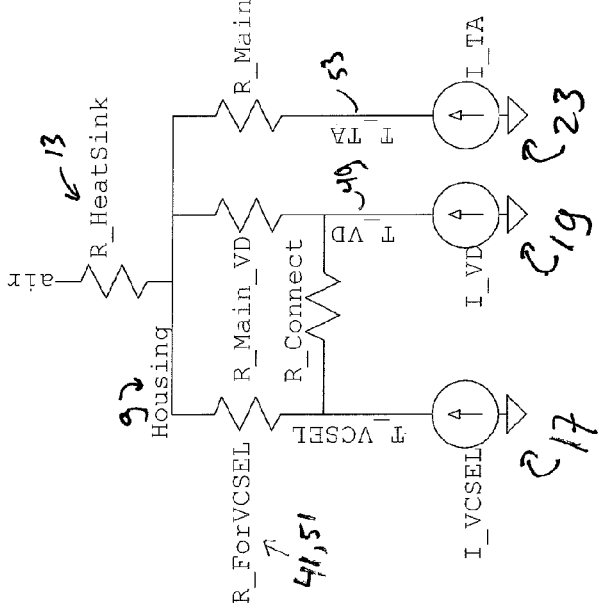
FIG. 6 is a schematic heat scheme of the transceiver of FIG. 1.

FIG. 6 shows a simplified model of the effective arrangement: each active and heat generating component 17, 19, 23 has an individual heat path to the heat sink 13 (described above), which suffers particular thermal resistances underway; R_ForVCSEL, R_Main_VD, R_Main_TA for the VCSEL 17, the VCSEL driver 19 and the transceiver amplifier 23, respectively, to the common heat sink 13, which suffers a resistance R_HeatSink to air and loss from the considered system (boundaries).

The VCSEL 17 and the VCSEL driver are thermally connected with a thermal resistance R_Connect, which is about equal to or, preferably, significantly higher than R_ForVCSEL+R_Main_VD. Thus, the VCSELs 17 and the VCSEL driver 19 (and the transceiver amplifier 23) are thermally largely decoupled. As a result, proper if not optimal thermal management and thermal operating conditions for each component 17, 19, 23 may be achieved by appropriately tuning the thermal resistances R_ForVCSEL, R_Main_VD, R_Main_TA. Note that in prior art optical devices and in particular transceivers, it was aimed to minimize R_Connect, causing elevation of the temperature of the VCSELs with damaging effects.

Figure 8:
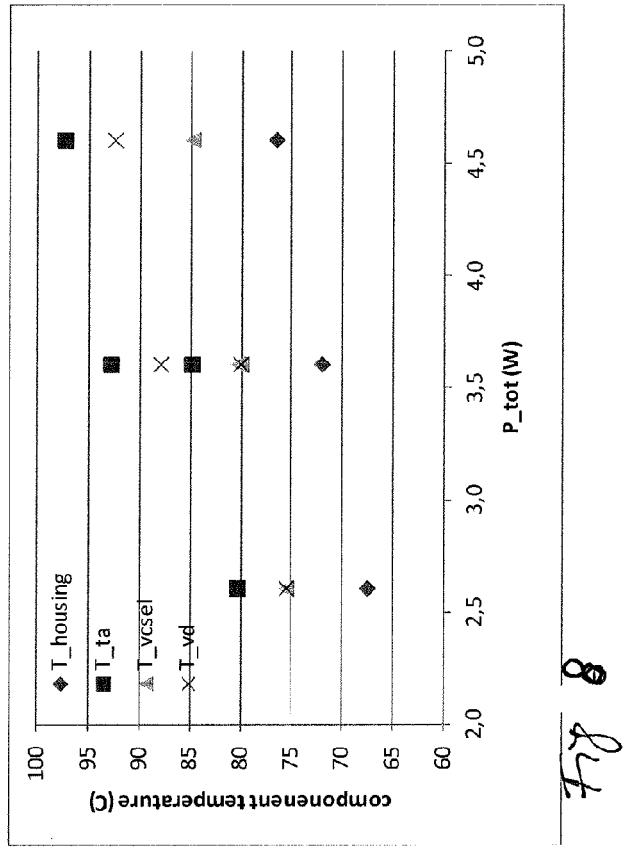
FIG. 8 is a graphical representation of the results of a simulation according to FIGS. 6 and 7.

FIG. 7: Table 1 shows the result of a simulation with the scheme of FIG. 6 with appropriately selected values for the respective thermal circuit elements, for different total operating powers $P_{TOT}$ (in Watt) of the transceiver, including operation of zero, one or two times a power-hungry clock data recovery system in the amplifier 23 ($P_{TIA}$): listed as "no CDR", "1×CDR" and "2×CDR", respectively. The power dissipations of the VCSEL driver $P_{VD}$ and the VCSELs themselves $P_{VCSEL}$ were kept constant. FIG. 8 is a graphical representation of the results. This shows that, indeed, the VCSELs 17 and the VCSEL driver 18 (and the amplifier 23 and the housing 11) are at different temperatures, wherein the VCSEL 17 is at an operating temperature at or even just below the safety limit of 85 degrees Celsius, even at the highest operating power of 4.74 W.

The present disclosure is not restricted to the above described embodiments which can be varied in a number of ways within the scope of the claims. For instance the first amount of heat and the second amount of heat can be the same or different from one another. The first electrical component and the second electrical component can be the same or different from one another. The first and second electrical components can be electrically connected to one another or electrically insulated from one another. The first and second electrical components can be connected to a common heat sink, individually connected to separate thermally separated heat sinks, individually connected to a common heat sink comprising two thermally separated sections, cooled by a common heat dissipation mechanism (such as a cooling fan, ambient air or liquid cooling system), or cooled individually by separate heat dissipation mechanisms. The heat sink or heat sinks can be part of a substrate, part of the first or second electrical components, or a separate piece or separate pieces that thermally connect to the first and second electrical components. The heat sinks can be made from any thermally conductive material, such as metal, thermally conductive plastic, etc. The heat sinks can be the same shape as one another, the same size as one another, differently shaped or sized from one another, made from the same material, or made from different materials. The heat sinks can have the same thermal resistance or different thermal resistances.

Elements and aspects discussed for or in relation with a particular embodiment and/or listed in a particular claim may be suitably combined with elements and aspects of other embodiments and/or claims, unless explicitly stated otherwise.

The invention claimed is:

1. An electrical component assembly comprising:
a substrate comprising a plurality of electrically conductive layers; and
first and second electrical components attached to the substrate, wherein:
the first and second electrical components are operably connected with each other via a first conductive path that extends on a first of the electrically conductive layers of the substrate,
the first electrical component is further connected to a second conductive path on a second of the electrically conductive layers of the substrate via the second conductive path having a width larger than the first conductive path, and
the second electrical component is further connected to a third conductive path on the second of the electrically conductive layers of the substrate via the second conductive path having a width larger than the first conductive path and being separated from the second conductive path on the second of the electrically conductive layers, and
wherein the first electrical component is configured to generate a first amount of heat in use and the second component is configured to generate a second amount of heat in use,
wherein the first electrical component is thermally connected with a heat sink along a first heat path and the second electrical component is connected with the heat sink along a second, different, heat path, such that a thermal conductivity between the first and second electrical components is lower than the thermal conductivity of the first heat path and of the second heat path.

2. The electrical component assembly of claim 1, wherein the assembly comprises a transmitter, wherein the first electrical component is a signal transmitter and the second electrical component is a transmitter driver for driving the signal transmitter.

3. The electrical component assembly of claim 1, wherein the first electrical component is a light source and the second electrical component is a light source driver,
wherein the light source is operably connected to the light source driver via the first conductive path,
wherein the light source is thermally connected to the heat sink along the first heat path, and
wherein the light source driver is thermally connected to the heat sink along the second heat path.

4. The electrical component assembly of claim 3, wherein the light source comprises one or more solid state light sources.

5. The electrical component assembly of claim 1, wherein the substrate comprises a polymeric material.

6. The electrical component assembly of claim 1, wherein the substrate is received in a socket, and the socket is an interposer for surface connection with the substrate.

7. The electrical component assembly of claim 6, wherein the interposer is connected with the substrate via a connector or connector assembly.

8. The electrical component assembly of claim 1, wherein the assembly comprises a transceiver, comprising a signal transmitter and a signal receiver.

9. The electrical component assembly of claim 8, wherein the transceiver is an optical transceiver.

10. The electrical component assembly of claim 1, wherein the assembly comprises one or more optical signal receivers.

11. The electrical component assembly of claim 1, wherein the assembly comprises an amplifier attached to the substrate.

12. The electrical component assembly of claim 11, wherein the amplifier is thermally connected to the heat sink along a third heat path different from the first heat path and the second heat path, wherein thermal conductivity between the amplifier and at least one of the first and second electrical components is lower than the thermal conductivity of the third heat path and of the second heat path.

13. The electrical component assembly of claim 1, wherein the first conductive path comprises a trace having relatively little width and a high electrical and thermal resistance and the second and third conductive paths comprise lanes having relatively large width and a low electrical and thermal resistance, wherein the first electrical component is connected with the second electrical component via the traces and to different parts of the substrate with the lanes, such that a higher thermal conductivity is provided between the first electrical component and the different parts of the substrate than between the first and second electrical components.

14. The electrical component assembly of claim 13, wherein the second and third conductive paths comprise portions of a ground plane on the second conductive layer, with the second conductive path being separated on the second conductive layer from the third conductive path.

15. The electrical component assembly of claim 1, wherein the second electrically conductive layer comprises a ground plane.

16. The electrical component assembly of claim 1, wherein the substrate is received in a socket, the heat sink being attached to the socket, wherein the first and second electrical components are sandwiched between the heat sink and the substrate.

17. The electrical component assembly of claim 1, being an on board optical transceiver and comprising an interposer and a plurality of Vertical Cavity Surface Emitting Lasers (VCSELs), a VCSEL driver, a plurality of photodiodes and a transceiver integral amplifier attached to the substrate,
the substrate being received in a socket,
wherein the VCSELs are operably connected to the VCSEL driver,
wherein the photodiodes are connected to the transceiver integral amplifier,
wherein the VCSEL driver and the transceiver integral amplifier are thermally connected to the heat sink on a side thereof opposite to the substrate,
wherein the first conductive path comprises traces having relatively little width and a high electrical and thermal resistance and the second and third conductive paths comprise lanes having relatively large width and a low electrical and thermal resistance,
wherein the VCSELs are connected with the VCSEL driver via the traces and to different parts of the substrate with the lanes, such that a higher thermal conductivity is provided between the VCSELs and the different parts of the substrate than between the VCSELs and the VCSEL driver.

18. A method for operating an electrical component assembly comprising a substrate having a plurality of electrically conductive layers, the method comprising:
generating heat from a first component attached to the substrate;
generating heat from a second component attached to the substrate,
communicating electrical signals between the first component and the second component via a first conductive path that extends on a first of the electrically conductive layers of the substrate,
conducting heat from the first component to a heat sink via a first heat path including a first electrically conductive lane on a second of the electrically conductive layers; and
conducting heat from the second component to a heat sink via a second heat path including a second electrically conductive lane on the second of the electrically conductive layers,
wherein the first and second electrically conductive lanes are wider than the first conductive path such that the thermal conductivity between the first and second components is lower than the thermal conductivity of the first heat path and of the second heat path.

19. The method of claim 18, wherein the first conductive path comprises traces having relatively little width and a high electrical and thermal resistance and the first and second lanes comprise portions of a ground plane having relatively large width and a low electrical and thermal resistance, wherein the first component is connected with the second component via the traces and to different parts of the substrate with the lanes, such that a higher thermal conductivity is provided between the first component and the different parts of the substrate than between the first and second components.

20. The method of claim 19, wherein conducting the heat from the first component comprises conducting the heat from the first component away from the second component via the lanes.

* * * * *